United States Patent [19]

Lee

[11] Patent Number: 4,936,808
[45] Date of Patent: Jun. 26, 1990

[54] METHOD OF MAKING AN LED ARRAY HEAD

[75] Inventor: Jong-Boong Lee, Seoul, Rep. of Korea

[73] Assignee: Samsung Electronics Co., Ltd.

[21] Appl. No.: 358,161

[22] Filed: May 30, 1989

[30] Foreign Application Priority Data

Dec. 12, 1988 [KR] Rep. of Korea ............. 1989/16530

[51] Int. Cl.⁵ .................................................. H01J 9/00
[52] U.S. Cl. .......................................... 445/24; 357/19
[58] Field of Search ..................... 445/23, 24, 25, 46; 430/139; 357/19

[56] References Cited

U.S. PATENT DOCUMENTS

| | | | |
|---|---|---|---|
| 3,860,424 | 1/1975 | Johnson | 445/24 |
| 3,914,137 | 10/1975 | Huffman | 357/19 |
| 4,040,078 | 8/1977 | Eckton | 357/19 |
| 4,611,886 | 9/1986 | Cline | 357/19 |
| 4,775,645 | 10/1988 | Kurata | 357/19 |

Primary Examiner—Kurt Rowan
Attorney, Agent, or Firm—Fleit, Jacobson, Cohn, Price, Holman & Stern

[57] ABSTRACT

There is disclosed a method of making an LED array head capable of simplifying an electrical wiring arrangement process between an individual electrode of each LED component and an external wiring upon formation of the LED array on a ceramic substrate. The inventive method includes the steps of: forming an external wiring on a portion of top surface of a substrate having a recess and an internal wiring on an entire top surface of said recess; bonding a respective LED component into said recess; forming an insulating film on the entire top surface of the substrate and the LED component; forming contact windows by selectively etching said insulating film so as to make access to the external wiring and an individual electrode disposed on the top surface of said LED component; and forming secondary wiring for electrically coupling the individual electrode with the external electrode through said contact windows.

14 Claims, 4 Drawing Sheets

METHOD OF MAKING AN LED ARRAY HEAD

BACKGROUND OF THE INVENTION

1. Field of the Invention

The present invention relates to a method of making a light-emitting-diode (LED) array head for use in semiconductor device manufacturing, and in particular to a simplified connection between each electrode of the array element and exterior wiring without using gold wire therebetween during manufacturing of the LED array on a substrate such as ceramic material.

2. Brief Description of Prior Arts

As data processing capacity of computers increase continuously these days, a printer as its data outputting device is also required to make its printing speed high and have high-resolution and multiple functions. As a result, for such a requirement, there has been often used an LED printing system utilizing an LED array head having a great number of light emitting components, thereby obtaining high resolution of printing quality. Generally, such an LED array head can be constructed with a large-scale integration of light-emitting-diodes (LEDs). Hence those LED arrays are mostly made onto a ceramic substrate, which fabricating process is known to be very difficult to do.

FIG. 1 shows a portion of a known LED array for the above described object, wherein a reference numeral 1 is a GaAs-substrate, 2 is a GaAsP-film, 3 is an insulating film, 4 is a zinc-diffusion region, 5 is a P-type individual electrode of LED, 6 is an N-type common electrode, and 7 is a light-emitting surface. When a voltage is applied to the N-type common electrode 6 and the P-type individual electrode 5 of the LED, light emission is made through the surface 7. These LED arrays can be arranged in order as shown in FIG. 2, because the P-type individual electrode 5 is disposed onto the light-emitting surface 7 and the N-type common electrode is disposed towards the substrate.

FIG. 2 is a schematic diagram showing an assembled portion of the known LED array head. Thus, when an LED array 13 is assembled onto a ceramic substrate 11 with formed thereon a common electrode wiring 14 and an external wiring 12, the common electrode 6 of the LED is to be coupled to the common electrode wiring 14, and the individual electrode 5 of each LED component is to be coupled to the external wiring 12 by using a gold wire 15, one by one. However, upon the gold wire connection, a total 2048 times of metalic connections will be required to print out an A4-size paper with 240 DPI (Dots per Inch) resolution of commonly used characters, and also a total of 3584 times of metalic connections will be required to print out the same paper with 400 DPI resolution. Further, since the interval between each gold wiring reaches about 100/μm, there will eventually arise a problem that its manufacturing process is difficult and the yield decreased.

SUMMARY OF THE INVENTION

Accordingly, it is an object of the present invention to provide a method of making an LED array head capable of simplifying an electrical wiring arrangement between an individual electrode of each LED component and an external wiring upon formation of the LED array on a ceramic substrate.

To achieve the above object and other advantages of the invention, the method of making a light-emitting-diode (LED) array head assembly including the following steps of:

forming an external wiring 22 on a portion of top surface of a substrate 20 having a recess 21, and an internal wiring 24 on an entire top surface of said recess, said internal wiring being used for a common electrode of the LED array;

bonding a respective LED component 26 into said recess;

forming an insulating film 30 on the entire top surface of the substrate and the LED component;

forming contact windows 31, 32 by selectively etching said insulating film so as to make access to the external wiring and an individual electrode 5 disposed on the top surface of said LED component; and forming a secondary wiring 34 for electrically coupling the individual electrode with the external electrode through said contact windows.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENT

Figure 1:
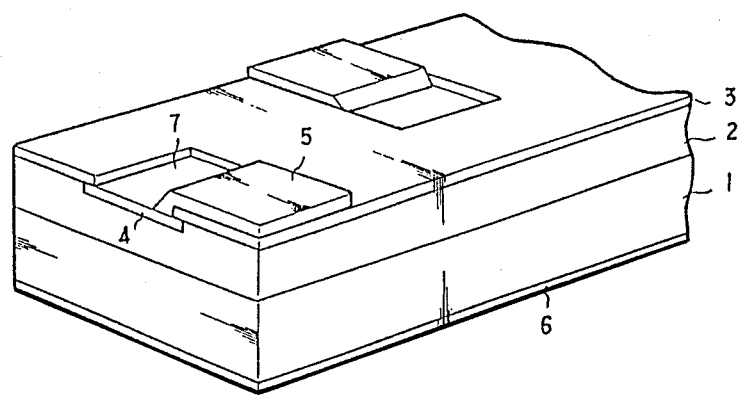
FIG. 1 is a schematic diagram of a portion of a known LED array head.
Figure 2:
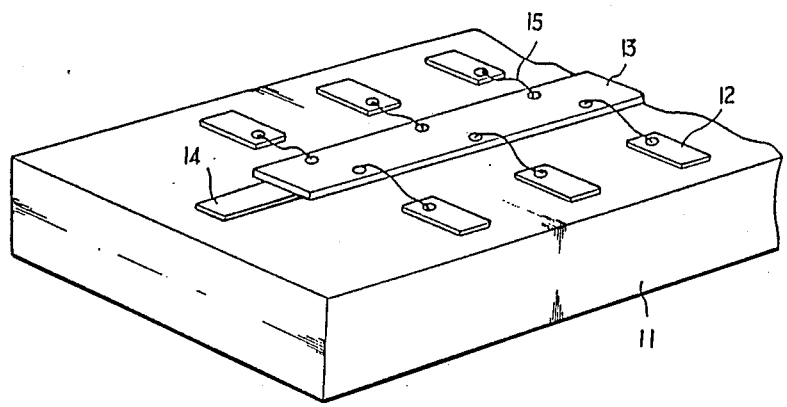
FIG. 2 is a schematic diagram of an assembled portion of the known LED array head.
Figure 3:
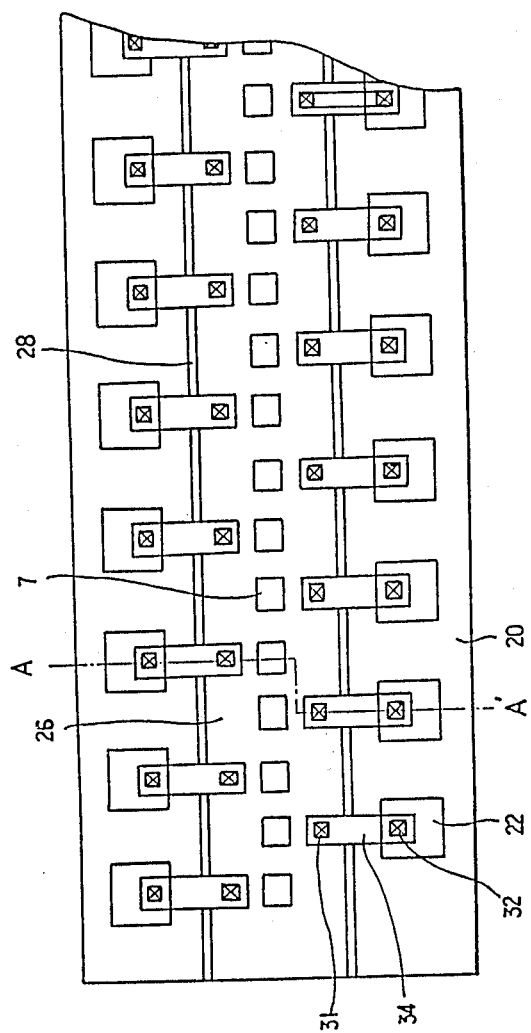
FIG. 3 is a plain view of a preferred embodiment of an LED array head according to the invention.

Referring to FIG. 3, a preferred embodiment of the inventive LED array head assembly comprises a plurality of light-emitting surfaces 7 disposed in a row along a center line of a ceramic substrate 20, an LED array component 26 having the same number of individual electrodes as the light-emitting surfaces, a plurality of external wirings 22 of the same number as the light-emitting surfaces, said external wirings being disposed on the ceramic substrate 20, and a plurality of secondary wirings 34 of the same number as the light-emitting surfaces 7, said secondary wirings each electrically coupling the respective individual electrode of one LED with the corresponding external wiring 22 through two contacts 31, 32.

Figure 4A:
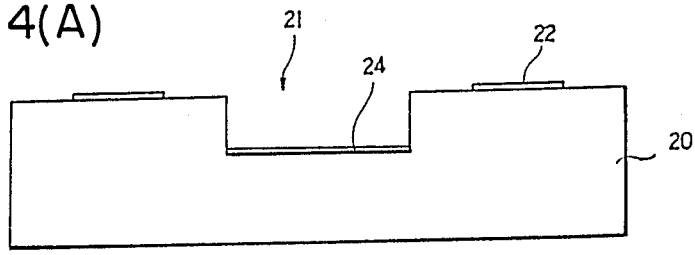
FIGS. 4(A) to (E) are cross-sectional views of a portion A—A' of the LED array head assembly of FIG. 3, showing each fabrication stage according to the invention.

Referring to FIG. 4(A), about 10 μm thick of aluminium film is formed on a ceramic substrate 20 having a recess 21 as deep as the thickness of an LED array component 26 explained later. For this purpose, a known vacuum evaporation technology will be preferable. Then, by using a conventional photo-etching technique, a primary wiring 24 for a common electrode of the LED array and an external wiring 22 are formed on the substrate, respectively.

Figure 4B:
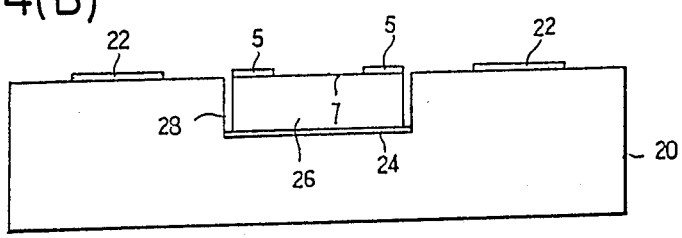
Figure 4C:
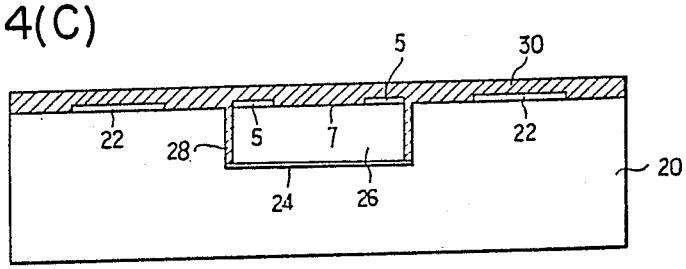

FIG. 4(B) shows that an LED array component 26 is arranged onto the recess 21 so that an individual electrode 5 is formed just on the top surface of the LED array component. For bonding these elements to each other, epoxy plastic material may be used. Then, the top surface of the substrate 20 and the LED array component 26 are coated with a non-conductive material of low viscosity such as Spin-On-Glass (SOG), so that the vertical space 28 between the substrate 20 and the LED array component 26 are filled out and its entire surface is flattened, as shown in FIG. 4(C). Thereafter, all the material is heated under the temperature of 400° C. for about ten minutes, thereby forming an insulating film 30 about 3 μm thick.

Figure 4D:
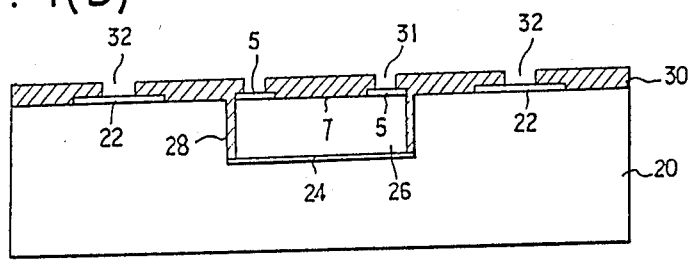

Then, a know photo-etching technique is used to form contact windows 31, 32 over the individual electrodes 5 and the external wiring 22, as shown in FIG. 4(D).

Figure 4E:
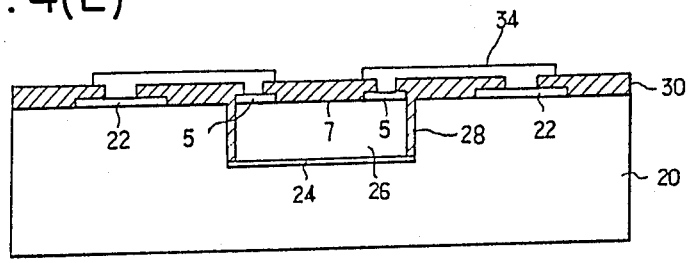

Thereafter, referring to FIG. 4(E), on the entire top surface of the substrate is formed a metal film such as aluminium 2-μm thick, so that electrical connections are made between the individual electrode 5 and the external wiring 22 through the contact windows 31, 32, thereafter removing unnecessary parts the metal film by using the known photo-etching technic. Hence, a secondary wiring 34 comes out over the top surface of the substrate. Consequently, when a voltage is applied to the external wiring 22 and the internal wiring 24, each LED component as described above emits light through the surface 7.

As is apparent from the aforementioned description, the present invention makes it easy to manufacture the LED array head assembly, because it employs a simplified wiring method utilizing the metal coating and photo-etching technique other than a separate gold-wiring method using conventionally, upon making a wiring between an external wiring of substrate and an individual electrode of the LED array component. Moreover, since the wiring failure due to mechanical contact can be reduced, device reliability will be considerably increased.

While the invention has been particularly shown and described with reference to a preferred embodiment, it will be understood by those skilled in the art that modifications in detail may be made without departing from the spirit and scope of the invention.

What is claimed is:

1. A method of making a light-emitting-diode (LED) array head assembly, comprising the steps of:
   forming an external wiring on a portion of a top surface of a substrate having a recess, and an internal wiring over an entire top surface of said recess, said internal wiring being used for a common electrode of the LED array;
   bonding a respective LED component into said recess and disposing an individual electrode on the top surface of said LED component;
   forming an insulating film over the entire top surface of the substrate and the LED component;
   forming contact windows by selectively etching said insulating film to make access to the external wiring and said individual electrode; and
   forming a secondary wiring for electrically coupling the individual electrode with the external electrode through said contact windows.

2. A method according to claim 1, wherein said recess has a depth approximately equal to the thickness of the LED component.

3. A method according to claim 2, wherein the LED component is bonded within said recess by using epoxy plastic material said the individual electrode is disposed at a uppermost portion of the LED component.

4. A method according to claim 3, wherein said insulating film is made from a non-conductive material of low viscosity through a thermal process.

5. A method according to claim 4, further comprised of making said secondary wiring of aluminum film about 2 μm thick through metal vacuum evaporation and photo-etching.

6. A method according to claim 1, further comprised of filing vertical spaces separating facing surfaces of said recess and LED component, with said insulating film.

7. A light emitting diode, comprising:
   a substrate having an elongate recess centrally disposed adjacent to a first top surface of said substrate with said first top surface extending substantially contiguous to said recess, said recess having a depth and a first width;
   a first thin film of an electrically conducting material disposed on said first top surface;
   a second thin film of an electrically conducting material disposed within said recess;
   a light emitting element having an individual electrode and light emitting area disposed on a second top surface, said light emitting element being disposed within said recess and on said second thin film;
   an insulating film covering the exposed top surface of said substrate and said light emitting element except for said first thin film and said individual electrode; and
   a third thin film of an electrically conducting material disposed upon said insulating film to couple said first thin film and said individual electrode.

8. A light emitting diode according to claim 7, further comprising said recess have a depth and said light emitting electrode having a thickness substantially equal to said depth.

9. A light emitting diode according to claim 7, further comprising said recess having a first width and said light emitting element having a second width less than said first width to provide said spaces between adjacent surfaces of said light emitting element and said recess, said insulating film being disposed within said spaces and separating said adjacent surfaces.

10. A light emitting diode according to claim 9, further comprising said recess having a first width and said light emitting element having a second width less than said first width to provide said spaces between adjacent surfaces of said light emitting element and said recess, said insulating film being disposed within said spaces and separating said adjacent surfaces.

11. A light emitting diode array, comprising:
   a substrate having an elongate recess centrally disposed adjacent to a first top surface of said substrate with said first top surface extending substantially contiguous to said recess;
   a first plurality of spaced apart electrically conducting thin films disposed on said first top surface;
   a common electrode disposed within said recess;
   a light emitting element producing a second top surface, said light emitting element being disposed on said common electrode within said recess, said light emitting element having a plurality of paired individual electrodes and corresponding light emitting areas arranged in an array on second top surface;
   an insulating film covering the exposed top surface of said substrate and said light emitting element except for said first plurality of electrically conducting films and individual electrodes; and a second plurality of spaced apart electrically conducting thin films disposed on said insulating film and separately connecting corresponding ones of said individual electrodes and said first plurality of electrically connecting thin films.

12. A light emitting diode array according to claim 11, further comprising said recess have a depth and said light emitting electrode having a thickness substantially equal to said depth.

13. A light emitting diode array according to claim 11, further comprising said recess having a first width and said light emitting element having a second width less than said first width to provide said spaces between adjacent surfaces of said light emitting element and said recess, said insulating film being disposed within said spaces and separating said adjacent surfaces.

14. A light emitting diode array according to claim 13, further comprising said recess having a first width and said light emitting element having a second width less than said first width to provide said spaces between adjacent surfaces of said light emitting element and said recess, said insulating film being disposed within said spaces and separating said adjacent surfaces.

* * * * *